US012579350B1

(12) United States Patent
Wilmot et al.

(10) Patent No.: US 12,579,350 B1
(45) Date of Patent: Mar. 17, 2026

(54) SYSTEMS AND METHODS OF TRANSFERRING STATES IN DESIGN SIMULATION

(71) Applicant: Cadence Design Systems, Inc., San Jose, CA (US)

(72) Inventors: Andrew Robert Wilmot, Carlisle, MA (US); Neeti Khullar Bhatnagar, San Jose, CA (US); Zhiting Duan, Chelmsford, MA (US); Jan Jakub Kotas, Warsaw (PL); Przemyslaw Pawel Gaj, Jaworzno (PL)

(73) Assignee: Cadence Design Systems, Inc., San Jose, CA (US)

( * ) Notice: Subject to any disclaimer, the term of this patent is extended or adjusted under 35 U.S.C. 154(b) by 919 days.

(21) Appl. No.: 17/672,603

(22) Filed: Feb. 15, 2022

(51) Int. Cl.
G06F 30/3308 (2020.01)

(52) U.S. Cl.
CPC ................................. G06F 30/3308 (2020.01)

(58) Field of Classification Search
None
See application file for complete search history.

(56) References Cited

U.S. PATENT DOCUMENTS

| | | | | |
|---|---|---|---|---|
| 2004/0204892 A1* | 10/2004 | Sweet | ............ | G01R 31/318357 |
| | | | | 702/117 |
| 2011/0184713 A1* | 7/2011 | Yang | ........................ | G06F 30/33 |
| | | | | 703/13 |
| 2018/0322028 A1* | 11/2018 | Davis | .................. | G06F 11/3636 |

OTHER PUBLICATIONS

Commonly Used Unix Commands. [online]. Krishna Training, Mar. 22, 2017 [retrieved on Dec. 3, 2024] <URL: https://web.archive. org/web/20170322232559/https://www.krishnatraining.com/post. php?pid=85&id=5&pt=32&gp=0> (Year: 2017).*
Silva, Mike. Introduction to Microcontrollers - Interrupts. [online]. Embedded Related, Sep. 18, 2013 [retrieved on Dec. 3, 2024] <URL: https://www.embeddedrelated.com/showarticle/469.php> (Year: 2013).*
Job control (Unix). [online]. Wikipedia, Dec. 3, 2021 [retrieved on Dec. 3, 2024] <URL: https://web.archive.org/web/20211203173720/ https://en.wikipedia.org/wiki/Job_control_(Unix)> (Year: 2021).*
Interrupt. [online] Wikipedia, Mar. 25, 2021 [retrieved on Dec. 3, 2024] <URL: https://web.archive.org/web/20210325163305/https:// en.wikipedia.org/wiki/Interrupt> (Year: 2021).*
Alwareadit, GeeksforGeeks: Difference between Thread Context Switch and Process Context Switch, May 25, 2020. <URL: https:// web.archive.org/web/20200808035633/https://www.geeksforgeeks. org/difference-between-thread-context-switch-and-process-context-switch/> (Year: 2020).*

* cited by examiner

*Primary Examiner* — Emerson C Puente
*Assistant Examiner* — Michael Paul Mirabito
(74) *Attorney, Agent, or Firm* — Foley & Lardner LLP

(57) ABSTRACT

Simulation methods and systems are disclosed. The method can include initiating a simulation of a circuit executing embedded software and at a first level of abstraction, receiving an indication to transfer a logic state of a first register of the circuit, from the first level to a second level of abstraction that is different from the first level. The method can also include transferring, responsive to the indication, the logic state from the first register at the first level of abstraction, to the first register at the second level of abstraction, to resume the simulation at the second level of abstraction.

20 Claims, 4 Drawing Sheets

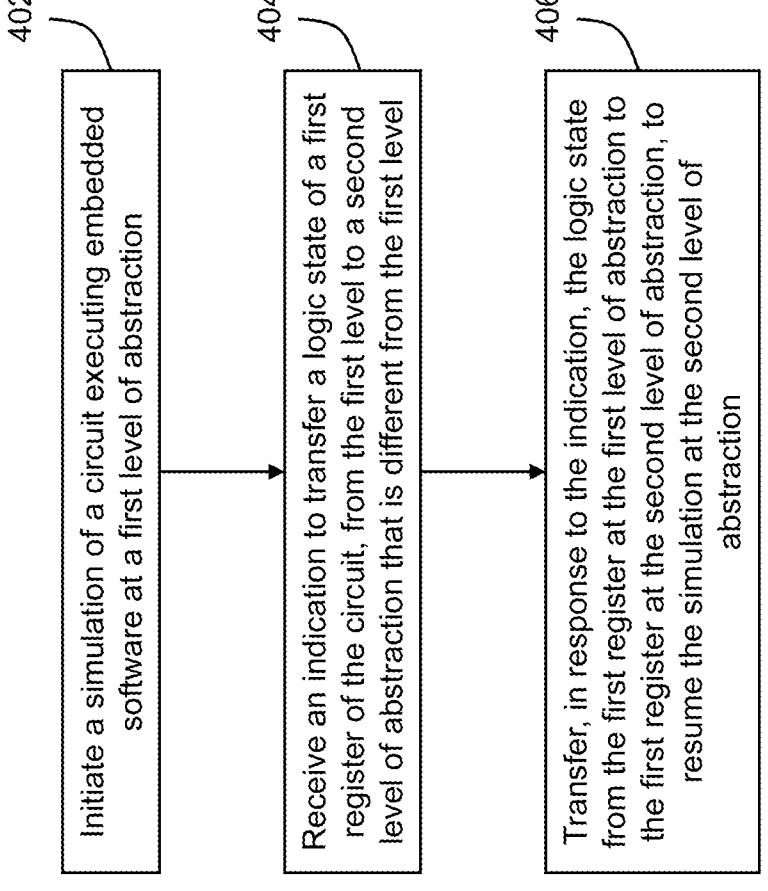

402 — Initiate a simulation of a circuit executing embedded software at a first level of abstraction 404 — Receive an indication to transfer a logic state of a first register of the circuit, from the first level to a second level of abstraction that is different from the first level 406 — Transfer, in response to the indication, the logic state from the first register at the first level of abstraction to the first register at the second level of abstraction, to resume the simulation at the second level of abstraction

FIG. 4

SYSTEMS AND METHODS OF TRANSFERRING STATES IN DESIGN SIMULATION

TECHNICAL FIELD

The present disclosure generally relates to systems and methods for transferring states in design simulation, including but not limited to transferring states between equivalent models of virtual and register-transfer level (RTL) abstractions within a single simulation session/environment/platform.

BACKGROUND

Verification is an integral aspect of developing electronic circuits and circuit boards. Semiconductor chips and circuit boards are becoming increasingly complex, leading to longer design and verification times. An added challenge is the ability to test embedded software and software applications without a hardware chip on which to host the software. This can lead to errors in the design and additional delays in bringing products to market. One conventional method of decreasing the verification time is to use a virtual platform which include hardware models being used to simulate embedded software. Although virtual platforms can significantly decrease the design and verification time, the accuracy of the simulation results may decrease.

SUMMARY

The present embodiments relate to methods and systems of implementing gearshift operations that may seamlessly translate/migrate/transfer/shift simulation states from a higher level of abstraction (e.g., System-C in virtual platforms) to a lower level of abstraction (e.g., register-transfer level description). A gearshift operation may be implemented to models of the virtual platform and RTL (or lower) abstraction that are implemented using industry standard languages (e.g., SystemC/System Verilog and Verilog/VHDL, respectively). Furthermore, a single gearshift command may be implemented within a single simulation process, which may utilize third party processes like external software or hardware debuggers. The single gearshift command may also allow extensibility and/or generality so that a generalized hardware/software debugger scripting language can be used to implement the transfer/switching of different IP blocks between abstraction levels for simulation.

According to some aspects, embodiments relate to a method, performed by at least one processor, can include initiating a simulation of a circuit executing embedded software, at a first level of abstraction receiving an indication to transfer a logic state of a first register of the circuit, from the first level to a second level of abstraction that is different from the first level. The method can include transferring, by the at least one processor, responsive to the indication, the logic state from the first register at the first level of abstraction, to the first register at the second level of abstraction, to resume the simulation at the second level of abstraction.

Initiating the simulation at the first level of abstraction can include initiating execution of a first model of the circuit. The first model can comprise a virtual platform model or a model implemented in SystemC.

Resuming the simulation at the second level of abstraction may include executing a second model of the circuit. The second model can include a model implemented at an RTL abstraction. The first register may include a read-only register.

Simulation of the circuit at the first level of abstraction may proceed faster than simulation of the circuit at the second level of abstraction. Simulation of the circuit at the second level of abstraction may provide higher accuracy than simulation of the circuit at the first level of abstraction.

Receiving the indication to transfer the logic state may include executing a command. Executing the command may include accessing a configuration. The configuration may include an association between a first model of the circuit implemented at the first level of abstraction and a second model of the circuit implemented at the second level of abstraction. The configuration may further include an indication of a memory address to access the logic state of the first register.

The configuration may further include at least one of: a scripting file or command of a software debugger application. The configuration may include a scripting file or command of a hardware debugger application.

The circuit executing the embedded software may include at least one of a processor, a memory, or an interface controller device. The circuit executing the embedded software may include a universal serial bus (USB) device, a universal asynchronous receiver-transceiver device, or a network interface card.

The method may include transferring, by the at least one processor, logic states from a plurality of registers at the first level of abstraction, to the plurality of registers at the second level of abstraction. The method may include transferring the logic states to the plurality of registers at the second level of abstraction to resume the simulation at the second level of abstraction.

According to some aspects, embodiments relate to a simulation system. The simulation system may include at least one processor configured to initiate a simulation of a circuit executing embedded software, at a first level of abstraction, receive an indication to transfer a logic state of a first register of the circuit, from the first level to a second level of abstraction that is different from the first level, and transfer, responsive to the indication, the logic state from the first register at the first level of abstraction, to the first register at the second level of abstraction, to resume the simulation at the second level of abstraction.

The at least one processor may be configured to initiate the simulation at the first level of abstraction by initiating execution of a first model of the circuit. The first model may include a virtual platform model or a model implemented in SystemC (or System Verilog, or other alternatives).

The at least one processor may be configured to resume the simulation at the second level of abstraction by executing a second model of the circuit. The second model may comprise a model implemented at an RTL abstraction level.

Simulation of the circuit at the first level of abstraction may proceed faster than simulation of the circuit at the second level of abstraction. Simulation of the circuit at the second level of abstraction may provide higher accuracy than simulation of the circuit at the first level of abstraction.

The at least one processor may be configured to receive the indication to transfer the logic state by executing a command including accessing a configuration. The configuration may include an association between a first model of the circuit implemented at the first level of abstraction and a second model of the circuit implemented at the second level of abstraction. The configuration may further include an indication of a memory address to access the logic state of the first register.

The configuration may include at least one of: a scripting file or command of a software debugger application. The configuration may include a scripting file or command of a hardware debugger application.

The at least one processor may be configured to transfer logic states from a plurality of registers at the first level of abstraction, to the plurality of registers at the second level of abstraction. The at least one processor may be configured to transfer logic states to the plurality of registers at the second level of abstraction to resume the simulation at the second level of abstraction.

BRIEF DESCRIPTION OF THE DRAWINGS

These and other aspects and features of the present embodiments will become apparent to those ordinarily skilled in the art upon review of the following description of specific embodiments in conjunction with the accompanying figures.

FIG. 4 is a flow chart illustrating an example method of simulating a design, according to some embodiments.

DETAILED DESCRIPTION

Figure 1:
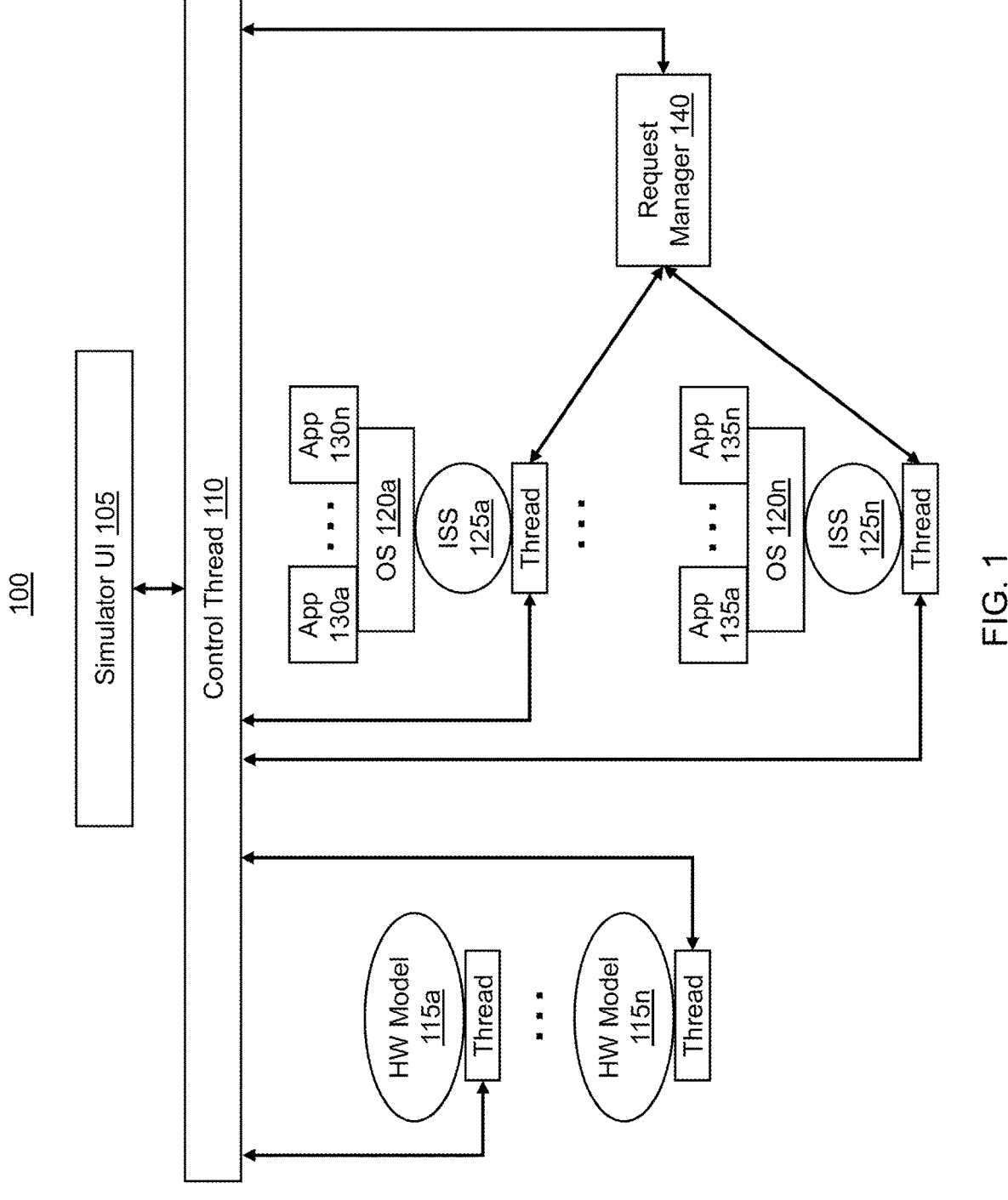
FIG. 1 illustrates an example virtual platform, according to some embodiments.

The present embodiments shall now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments shall be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Event-driven simulation environments may allow simulation of electronics hardware elements modeled at various levels of abstraction. When integrated with processor models implementing instruction set simulators (ISS), the event-driven simulation environment may simulate the behavior of the actual cross-compiled embedded software running on processor models within the system. Such a collection of hardware models capable of running collections of embedded software is sometimes referred to as a virtual platform, which is described in U.S. Pat. Nos. 9,262,299, 9,262,305, and 10,339,229 which are hereby incorporated by reference in their entirety.

A virtual platform may also be integrated with processor models (and other models of electronics hardware) which may be implemented at the RTL abstraction level or lower levels of abstraction, e.g., using Verilog or VHDL. Such RTL processors may run/execute/model (or operate with, or be modeled with) embedded software. Such a collection of mixed abstraction models to represent an actual electronics system can be termed herein as a "hybrid platform" in this disclosure. Elements of the hybrid platform which are not part of the virtual platform may have their behavior executed in an event-driven simulator or in specialized hardware which accelerates the behavior execution, e.g., emulators and hardware prototyping systems.

A type of hybrid platform may be constructed, where certain intellectual property (IP) blocks may be equivalently implemented in both the virtual platform abstraction level and the RTL abstraction level. Such IP blocks may include at least one processor, but may potentially include other IP blocks such as interrupt controllers, timers, etc. These platforms can be termed a "gearshift hybrid platform" herein, and the state transfer between IP blocks modeled at different abstraction levels may be termed a "gearshift" operation herein. The gearshift hybrid platform may additionally include other IP blocks which are not equivalently implemented in either abstraction. The platform may be constructed/configured so that those IP blocks are accessible either from the virtual platform abstraction level or RTL abstraction level so the states of those IP blocks need not be transferred as part of the gearshift operation, allowing for the efficient transfer of only some key IP blocks that are crucial to fast virtual platform execution.

When a gearshift hybrid platform is constructed, a mechanism to transfer the state of each IP block between abstractions using software debugger and/or hardware debugger technologies may be implemented. The advantage of shifting such state is to allow a gearshift hybrid platform to run quickly using the virtual platform abstraction at reduced accuracy, transfer state to RTL IP blocks and then run at increased accuracy. When the processor is running sophisticated software like an Operating System (e.g., Linux or Android), this can result in greatly increased simulation speeds to reach a point of interest (for example, an application running well after the Linux or Android system has booted) when verifying the functional or other aspects of a modeled electronics system, and then running the simulation onward from that point of interest at that increased accuracy. Such a gearshift operation may advantageously help speed up the software bring-up stage of a system design, even before a design team has a physical chip to test, while increasing accuracy of hardware/software co-verification. Furthermore, this debugger may be implemented across any verification engine (e.g., logic simulators, hardware-based emulators, field-programmable gate array (FPGA) prototyping systems, etc.).

FIG. 1 illustrates an example virtual platform 100, according to some embodiments. A simulator interface 105 (sometimes referred to as simulator user interface (UI) 105) may be implemented to provide control and observability for the components of the virtual platform 100. The simulator interface 105 may be executed on a control thread 110. Although certain components are shown, embodiments are not limited thereto and there may be more or fewer components within embodiments of the virtual platform 100.

A modeled component as described herein refers to either a hardware component, a bare-metal software program or operating system (OS) running within the context of a processor hardware component, or a process running on an OS running within the context of a processor hardware component. The virtual platform 100 may run (e.g., execute/implement) multiple hardware component models in sequence, with each modeled hardware component using separate host platform resources. Platform resources can include a simulator thread or process, or a call stack that is maintained for each modeled component. A simulator thread as used herein can refer to a hardware component modeled within an event-driven simulator which has its own call stack context.

Simulator interface 105 may run in a control thread 110 separate from the modeled components of the virtual platform. State information and other simulation related information for the modeled components may then be made available via simulation commands executed by the control thread 110 when control of the simulation returns to the control thread 110.

Each modeled component may be executed on a simulator thread. For example, each hardware model may be executed on a simulator thread of the virtual platform 100. When a modeled component is executed in the course of the event driven simulation, the simulator thread for that model may become active. When a breakpoint or watchpoint in the source code implementing the modeled component is reached, the active simulator thread may yield control to the control thread 110. In this disclosure, the term "breakpoint" can include "watchpoint" and generally mean any point or time in the simulation where the user wishes to engage the gearshift operation.

For example, the breakpoint can include a place of interest for the user where the user wishes to simulate a design at a lower (or more detailed) level. This may include, for example, a design that begins the simulation in SystemC or System Verilog and then later simulates in Verilog or VHDL. When the simulation reaches a breakpoint in the simulation based on, for example, a configuration setting in a configuration file, the simulation may pause at the breakpoint. The breakpoint may include a certain time period after the simulation has begun or the breakpoint may be triggered when certain conditions are met (e.g., one or more signals in the simulation have a certain logic level). Once the simulation reaches the breakpoint, the processor may engage the gearshift operation such that the logic state is transferred to a lower level of abstraction (e.g., RTL) and then resume the simulation at the lower abstraction level. Further details on how this is accomplished is explained below.

The virtual platform 100 may use a processor model ISS models 125a-125n to access state information for the modeled components via an application programming interface (API). For example, function calls to the API may allow the system to display the embedded software view of the memory and the registers of the modeled system. Function calls of the API may also be used to set breakpoints and/or watchpoints which can return control from the active simulator thread to the control thread 110. Other APIs may access the state information of the various modeled components. Control mechanisms like stepping, breakpoints and/or watchpoints may be implemented by causing the active simulator thread implementing the modeled component currently being simulated to yield control from the simulator thread associated with the component model back to the control thread 110. A register (sometimes referred as a memory/storage register) as referenced herein may include any memory or storage element in a memory/storage, electronic and/or computing device, and can accept, store and/or transfer data (e.g., instruction data) in circuitry for instance.

Each of the modeled components of the virtual platform 100 may be simulated using individual platform resources as described above. Each of the multiple modeled hardware (HW) components 115a-115n may be executed with individual simulator threads. An OS 120a-120n may be simulated with reference to the ISS models 125a-125n modeling a processor instruction set running on a modeled hardware component. Then, each software application 130a-130n and 135a-135n or application process running on the OS may be executed as an OS process. Software applications 130a-130n and 135a-135n may include any process or application designed to run on the OS. For example, applications 130a-130n and 135a-135n may include a document editor, a game, a digital camera, an electronics design application, or other high-level application.

The ISS models 125a-125n may additionally interface with the control thread 110 via a request manager 140. The request manager 140, as directed by the control thread 110, may read the registers, memory, or other components modeled by the virtual platform 100 via an ISS API to extract state and other information from the simulator.

In some embodiments, the simulator interface 105 in combination with the request manager 140 may provide control and observability for all hardware and software components in the virtual platform 100. Representations of the OS data structures and entry points may be used by the simulation interface 105 or request manager 140 to provide improved observability and control over the simulation. For example, a breakpoint of a function in the OS source code that causes a switch between processes can be used to effect the addition of breakpoints or watchpoints specific to the process which is to be started or resumed, while removing breakpoints or watchpoints specific to the OS or to a prior process. Additionally, because the API is used to access memory, registers, or state information, function call may be used instead of creating or using a new process. Consequently, the debugging itself may not utilize a process on the OS that might interfere with the execution of the application.

The virtual platform 100 may include a unified software/hardware debugger and scripting language. This can allow the software debugger built-in to the simulator process to query processor register state from the virtual platform 100 processor and then use debugger operations to transfer the states of those registers to the RTL processor. Similarly, register states of other IP blocks may be read from the virtual platform and those registers written using debugger commands accessing the RTL processor. In some cases, additional hardware states may have to be transferred that cannot be transferred using the built-in software debugger (for example, the value associated with a read-only register like a timer value). In those cases, the integrated hardware debugger operation may be used to set the value of the equivalent hardware element in the equivalent RTL IP block.

While a single simulator command can be used to initiate the gearshift operation, the command can reference a configuration file which can specify the equivalent virtual platform and RTL blocks that the built-in debugger uses to perform the state transfer. This configuration file may in turn reference software/hardware debugger scripting files which can implement the transfer of the state of various IP blocks between the virtual platform and RTL abstractions.

Figure 2:
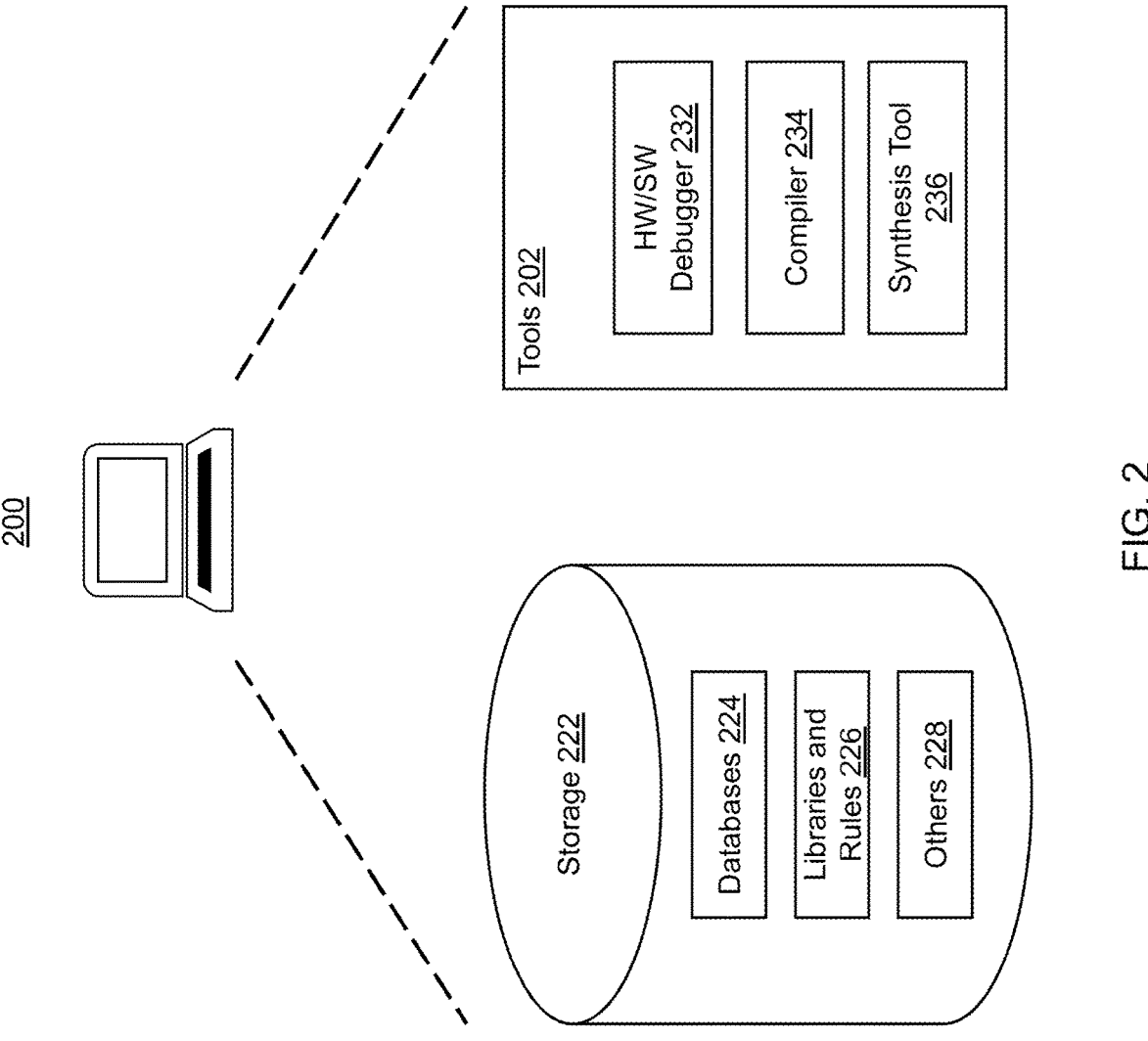
FIG. 2 is a functional block diagram of an example computing system for implementing the gearshift operation, according to some embodiments.

FIG. 2 is a functional block diagram of an example computing system 200 for implementing the gearshift operation, according to some embodiments. In some embodiments, the system 200 can be one or more computers that are loaded with software (e.g., EDA tools) and/or customized to include hardware for interactively and/or automatically implementing designs of integrated circuits (e.g., ASICs, SOCs, full custom digital ICs). In some embodiments, the one or more computing systems 200 comprise various components not shown such as processor(s) or processor core(s), memory, disks, etc. The software and/or custom hardware may include interactive or automated modules such as a placer, a routing engine, a layout editor, a wire editor, a design rule checker, a verification engine, a module generator, a synthesis tool, a simulator/verification-tool, and/or a floor-planner, as can be appreciated by those skilled in the art.

In one or more embodiments, the computing system 200 may further write to and read from a local or remote volatile or non-volatile computer accessible storage 222 that stores thereon data or information such as, but not limited to, one or more databases such as post-placement layouts, schematic design database(s) or physical design database(s) (e.g., GDS II or OASIS data, etc.), circuit stage credit database 224, libraries, rule decks, constraints (e.g., timing constraints such as required arrival time, etc.), etc. 226, and/or other information or data 228 (e.g., SystemC models, RTL models, software models, configuration file(s), netlists, derates, parasitic data, SDF, etc.) that may be required to support the methodology of the present embodiments. According to certain aspects, the databases and libraries in the storage 222 are extendable or changeable (e.g., via APIs and the like) without changing other components or data in system 200.

In some embodiments, the one or more computing systems are implemented in a "cloud" configuration and/or a client/server configuration. For example, one or more server computers may be loaded with application software (e.g., a router and/or other EDA tool) for implementing some or all of the methodology of the present embodiments, and one or more client computers can communicate with the server computer(s) via a network to perform some or all of the methodology of the embodiments for a particular design.

In some embodiments, the one or more computing systems 200 may, by various standalone software, hardware modules or combinations thereof 202 (e.g., EDA tool, hardware/software debugger 232, compiler 234, synthesis tool 236, etc.), include a processor that executes the processes and approaches discussed in this disclosure to perform the gearshift operation discussed in this disclosure. The processor can execute the method 400 and approaches discussed above in relation to FIGS. 1 and 3-4. The processor may be implemented by adapting or communicating with certain pre-existing modules (e.g., design workflow, design timing, design optimization, design sign-off, etc.) as may be required to implement a methodology to perform simulations according to the present embodiments. Those skilled in the art will be able to understand how to implement various examples of such modules after being taught by the present disclosure.

Figure 3:
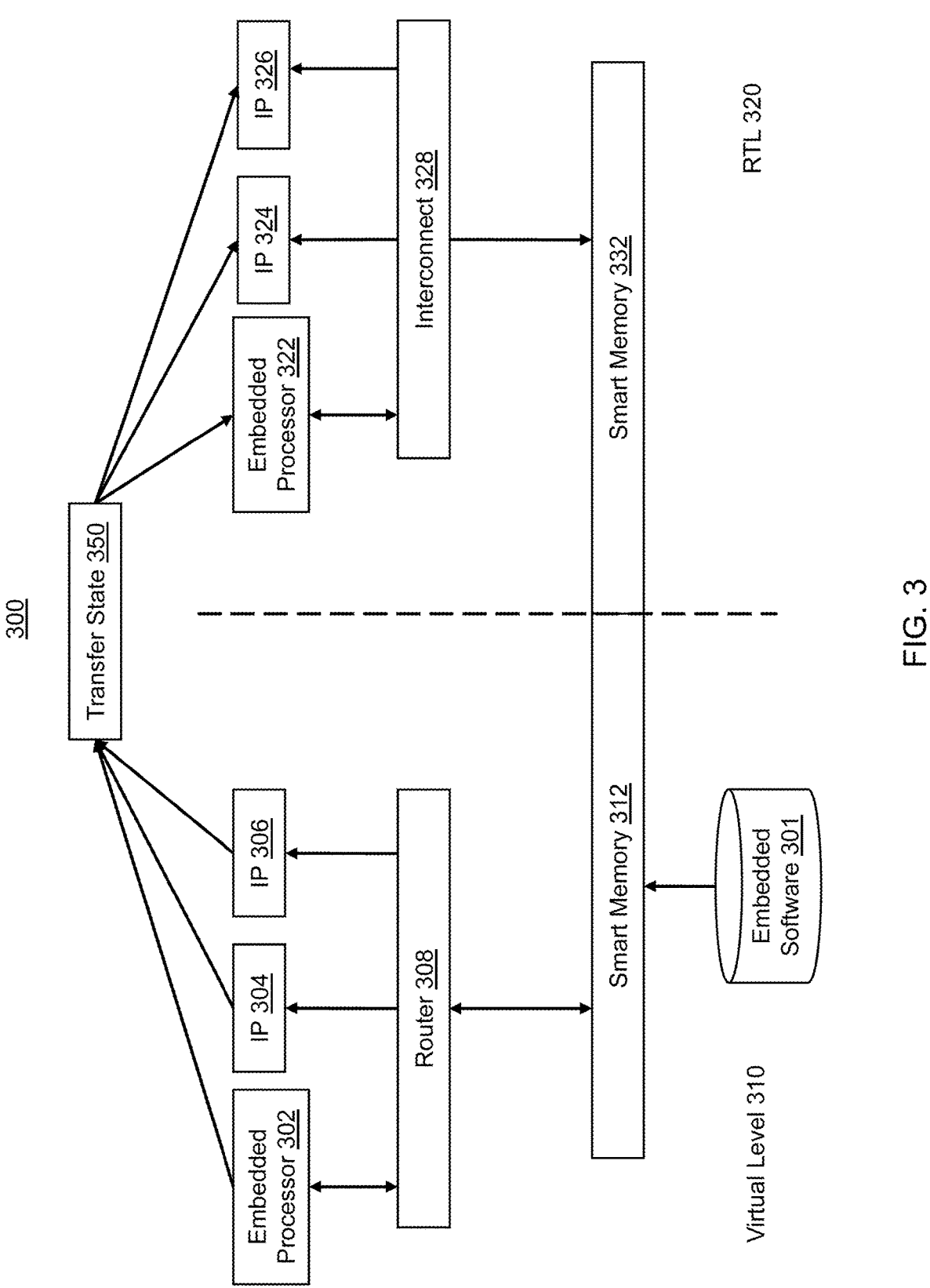
FIG. 3 illustrates an example block diagram describing operations of the hybrid platform, in accordance with some embodiments.

FIG. 3 illustrates an example block diagram 300 describing operations of the hybrid platform, in accordance with some embodiments. As described in this disclosure, the hybrid platform may allow the simulation of a design (IC, electronic, hardware/software design) in multiple levels of abstraction. For example, in FIG. 3, one level may include a virtual level 310 implemented in SystemC for instance (e.g., on virtual platform 100) and another level may include a lower level of abstraction such as RTL 320 (e.g., models implemented or described using hardware description language(s), such as Verilog). Although FIG. 3 includes certain components and certain connections between the components, embodiments are not limited thereto, and the hybrid platform may include additional and/or different components and connections between the components.

Implementing an embedded software 301 within the virtual level 310 allows the user (e.g., a software engineer) to design and/or test software at a high level of abstraction without having to have an actual hardware chip on which to run the software. When the user wants to simulate the embedded software 301, the user may run a simulation of the embedded software 301 on the virtual platform 100. On the virtual level 310 side, the simulation environment may include smart memory 312 such as that described in U.S. Pat. Nos. 8,943,449 and/or 8,793,628, the entire disclosures of which are incorporated by reference in their entirety. The smart memory 312 may include various components of the design, such as data memory and instruction memory. The smart memory 312 may be connected to a router 308 that may route the data from the smart memory 312 to and from the various IP blocks. The IP blocks may include, for example, an embedded processor 302, IP block(s) 304 and 306 (e.g., memories, interface controller device(s), USB device, network interface card, universal asynchronous receiver/transmitter, network interface card, etc.). Various models of the IP blocks may be stored in the storage 222 and can be instantiated for the simulation.

The user may wish to test the software at a lower level of abstraction in order to debug at a more detailed/accurate level. In such a case, the user can run a command in the virtual platform 100 console (e.g., simulator UI 105) to simulate at a lower level of abstraction. When the user runs the command, the command may refer to a configuration file that includes details on what IP block(s) the user wishes to simulate at the lower level as well as the equivalent IP block(s) that are designed/implemented at the RTL level (e.g., Verilog, VHDL, etc.). Once the command is run, the virtual platform 100 may direct the HW/SW debugger to transfer 350 the states of all of the IP block(s) of interest from the virtual level 310 to the RTL level 320, at a certain stage/point of the simulation.

On the RTL level 320, the states from the virtual level 310 may be transferred to the various registers that correspond to equivalent IP blocks from the virtual level 310. For example, within the RTL 320, an embedded processor 322 may be an IP block that is equivalent (e.g., functionally consistent/similar to a certain level) to the embedded processor 302 in RTL. Once the simulation is transferred from the virtual level 310 to the RTL 320, the state from the registers of the embedded processor 302 may be transferred to the registers of the embedded processor 322 in RTL. Then, the simulation may continue (e.g., resume, proceed, carry on) in RTL 320.

Similarly, an IP block 324 may exist in RTL that is equivalent to the IP block 304, and an IP block 326 may exist in RTL that is equivalent to the IP block 306. The states from the virtual level 310 for the IP blocks 304 and 306 may be transferred to the registers of the IP blocks 324 and 326, respectively. Then the simulation may continue from in the RTL 320.

Accordingly, the user may simulate a design in the hybrid platform by executing a gearshift command to simulate the design at the virtual level 310 to a point of interest. The user may transfer the state of the simulation from virtual level 310 to the RTL 320 (at the point of interest) and continue the simulation (from the point of interest). Because RTL 320 is more detailed and simulates all of the individual hardware circuit components, the simulation may be more useful for the user if the user wants to debug the design at a more detailed level. However, it may take a long time (e.g., days) to run the simulation at the more detailed level from the beginning. Accordingly, the disclosed embodiments of the hybrid platform's gearshift operation allows the user to simulate a portion of the design that includes (embedded) software, which runs much faster at a virtual level 310 or higher level of abstraction) until the user wishes to begin the simulation at the more detailed level. Once the gearshift operation begins, the user can continue to the simulation at the higher level of abstraction for more detailed and accurate debugging. This can save much time for the user while still maintaining the accuracy of lower level simulations.

A configuration file may be used to customize the gearshift operation. The gearshift operation command may reference the configuration file which can specify various parameters. For example, the parameters may include which IP block(s) is/are to implement the gearshift operation. For example, the user may wish to only see detailed simulation results for certain IP block(s), without having to simulate at the RTL 320 for all of the hardware components. Accordingly, the configuration file may specify which of the IP block(s) that the user is interested in. As another example, the parameters may specify the conditions under which the gearshift operation may be initiated. For example, the configuration file may include a certain condition (e.g., when variable=="1", or a certain point of time or stage in simulation) when the gearshift operation is triggered. As a further example, the configuration file may also specify the location(s) and/or name(s) of the equivalent IP blocks. For example, the configuration file may specify the location and/or name of the IP block 304 and the IP block 324 so that the virtual platform 100 can accurately transfer the register states. Furthermore, the configuration file may specify which read-only register may be written into in the RTL level 320. In addition to these parameters, additional parameters may be specified in the configuration (e.g., duration of simulation, output file, etc.)

FIG. 4 is a flow chart illustrating an example method 400 of simulating a design, according to some embodiments. The method 400 may be performed by one or more processors (e.g., system 200) at a user terminal or a server that is connected to the user terminal. The method 400 can include initiating a simulation of a circuit executing embedded software at a first level of abstraction (402). The method 400 can include receiving an indication to transfer a logic state of a first register of the circuit, from the first level to a second level of abstraction that is different from the first level (404). The method 400 can include transferring the logic state from the first register at the first level of abstraction to the first register at the second level of abstraction, to resume the simulation at the second level of abstraction (406).

The method 400 can include initiating a simulation of a circuit executing embedded software at a first level of abstraction (402). The simulation environment may be within the virtual platform 100 environment described in this disclosure. The first level abstraction may include the virtual level in, e.g., SystemC. An engineer, for example, may send a command to the virtual platform system, e.g., via system 200, to initiate simulation of a design. The software simulation may run using software and/or hardware models such that simulation results (e.g., register states) are produced relatively quickly. The simulation may run until a point of interest by the engineer. Various parameters of the simulation may be set using a configuration file that may specify the simulation of one or more IP blocks, duration of simulation, equivalencies of IP blocks, etc.

The method 400 can include receiving an indication to transfer a logic state of a first register of the circuit, from the first level to a second level of abstraction that is different from the first level (404). The indication may include a command that is input by the user during simulation and/or at the beginning of the simulation. As discussed above, the indication may include a single command in the HW/SW debugger (e.g., Eclipse SDK) that may run on the simulation and/or emulation system.

The method 400 can include transferring, responsive to the indication, the logic state from the first register at the first level of abstraction to the first register at the second level of abstraction, to resume the simulation at the second level of abstraction (406). In some scenarios, the second level of abstraction is a higher level of abstraction than the first level of abstraction, In some other scenarios, the second level of abstraction is a lower level of abstraction than the first level of abstraction, In some implementations, during a simulation session, gearshift operations may transition between multiple/different pairs of levels of abstraction in one or more directions (e.g., level 1 to level 2, then level 2 to level 3, then level 3 to level 1, etc.), which can depend on the desired simulation speed, accuracy and/or availability of models of different levels of abstraction for instance, during various stages of the simulation. The different levels of abstraction can correspond to different models (e.g., implemented/described in RTL, HDL, Hspice, AHDL, AHPL, Handel-C, System Verilog, SystemC, HHDL, HML, JHDL, MyHDL, etc.).

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method, comprising:

receiving, by at least one processor executing programming of a simulator for modeling a circuit design including one or more hardware components and embedded software, a configuration setting for a simulation of models of the circuit design;

initiating, by the at least one processor executing a first thread for the simulator associated with a first model of the circuit design implemented at a first level of abstraction, the simulation of the circuit design executing the embedded software for a simulation session of the simulator modeling the circuit design, at the first level of abstraction;

receiving, by the at least one processor, an indication to transfer a logic state of a first register of the circuit, from the first level to a second level of abstraction that is different from the first level during the simulation session; and transferring, by the at least one processor responsive to the indication, the logic state from the first register at the first level of abstraction to the first register at the second level of abstraction, to resume the simulation at the second level of abstraction during the simulation session using a second thread for the simulator associated with a second model of the circuit design implemented at the second level of abstraction and pausing the first thread.

2. The method of claim 1, wherein initiating the simulation at the first level of abstraction comprises initiating execution of a first model of the circuit, the first model comprising a virtual platform model.

3. The method of claim 1, wherein resuming the simulation at the second level of abstraction comprises executing a second model of the circuit, the second model comprising a model implemented at a register transfer level (RTL) abstraction.

4. The method of claim 1, wherein the first register comprises a read-only register.

5. The method of claim 1, wherein at least one of:
simulation of the circuit at the first level of abstraction proceeds faster than simulation of the circuit at the second level of abstraction; or
simulation of the circuit at the second level of abstraction provides higher accuracy than simulation of the circuit at the first level of abstraction.

6. The method of claim 1, wherein receiving the indication to transfer the logic state comprises executing a command, wherein executing the command comprises accessing a configuration.

7. The method of claim 6, wherein the configuration includes an association between a first model of the circuit implemented at the first level of abstraction, and a second model of the circuit implemented at the second level of abstraction.

8. The method of claim 7, wherein the configuration further includes an indication of a memory address to access the logic state of the first register.

9. The method of claim 7, wherein the configuration further includes at least one of: a scripting file or command of a software debugger application, or a scripting file or command of a hardware debugger application.

10. The method of claim 1, wherein the circuit executing the embedded software comprises at least one of: a processor, a memory, an interface controller device, a universal serial bus (USB) device, a universal asynchronous receiver-transceiver device, or a network interface card.

11. The method of claim 1, further comprising:
transferring, by the at least one processor, logic states from a plurality of registers at the first level of abstraction, to the plurality of registers at the second level of abstraction, to resume the simulation at the second level of abstraction.

12. A simulation system, comprising:
at least one processor configured to:
execute programming of a simulator for modeling a circuit design, the circuit design including one or more hardware components and embedded software;
receive a configuration setting for a simulation of models of the circuit design, the configuration setting indicating a transfer of logic state to a different level of abstraction at a breakpoint;
initiate the simulation of the circuit design executing the embedded software for a simulation session of the simulator using a first thread for the simulator associated with a first model of the circuit design implemented at a first level of abstraction;
pause the first thread of the simulation at the breakpoint during the simulation session;
transfer, during the simulation session, the logic state from a first register at the first level of abstraction, to the first register at a second level of abstraction; and
resume the simulation at the second level of abstraction during the simulation session using a second thread for the simulator associated with a second model of the circuit implemented at the second level of abstraction and pausing the first thread.

13. The simulation system of claim 12, wherein the at least one processor is configured to initiate the simulation at the first level of abstraction by initiating execution of a first model of the circuit, the first model comprising a virtual platform model.

14. The simulation system of claim 12, wherein the at least one processor is configured to resume the simulation at the second level of abstraction by executing a second model of the circuit, the second model comprising a model implemented at a register transfer level (RTL) abstraction.

15. The simulation system of claim 12, wherein at least one of simulation of the circuit at the first level of abstraction proceeds faster than simulation of the circuit at the second level of abstraction; or simulation of the circuit at the second level of abstraction provides higher accuracy than simulation of the circuit at the first level of abstraction.

16. The simulation system of claim 12, wherein the at least one processor is configured to receive the indication to transfer the logic state by executing a command including accessing a configuration.

17. The simulation system of claim 16, wherein the configuration includes an association between a first model of the circuit implemented at the first level of abstraction, and a second model of the circuit implemented at the second level of abstraction.

18. The simulation system of claim 17, wherein the configuration further includes an indication of a memory address to access the logic state of the first register.

19. The simulation system of claim 17, wherein the configuration further includes at least one of: a scripting file or command of a software debugger application, or a scripting file or command of a hardware debugger application.

20. The simulation system of claim 12, wherein the at least one processor is further configured to:
transfer logic states from a plurality of registers at the first level of abstraction, to the plurality of registers at the second level of abstraction, to resume the simulation at the second level of abstraction.

* * * * *